United States Patent
Mutoh

(10) Patent No.: US 8,115,851 B2
(45) Date of Patent: Feb. 14, 2012

(54) SOLID-STATE IMAGE CAPTURING APPARATUS, METHOD FOR MANUFACTURING SAME, AND ELECTRONIC INFORMATION DEVICE

(75) Inventor: Akiyoshi Mutoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 280 days.

(21) Appl. No.: 12/591,524

(22) Filed: Nov. 23, 2009

(65) Prior Publication Data

US 2010/0149397 A1    Jun. 17, 2010

(30) Foreign Application Priority Data

Dec. 17, 2008    (JP) .................... 2008-321522

(51) Int. Cl.
- H04N 3/14    (2006.01)
- H04N 5/335   (2011.01)
- H01L 27/148  (2006.01)
- H01L 21/00   (2006.01)
- H01L 21/339  (2006.01)

(52) U.S. Cl. ........ 348/311; 348/294; 257/225; 257/231; 438/60; 438/75; 438/144

(58) Field of Classification Search .................. None
See application file for complete search history.

(56) References Cited

U.S. PATENT DOCUMENTS

| | | | |
|---|---|---|---|
| 6,690,423 B1 * | 2/2004 | Nakamura et al. | 348/311 |
| 7,473,977 B2 * | 1/2009 | Kitano et al. | 257/435 |
| 7,781,715 B2 * | 8/2010 | Uya et al. | 250/208.1 |
| 2008/0296645 A1 * | 12/2008 | Itonaga | 257/294 |

FOREIGN PATENT DOCUMENTS

| | | |
|---|---|---|
| JP | 11-274461 A | 10/1999 |
| JP | 2001053260 A | 2/2001 |
| JP | 2005-072236 A | 3/2005 |
| JP | 2005-159062 | 6/2005 |
| JP | 2008-252123 A | 10/2008 |
| KR | 10-2004-0032004 | 8/2006 |

OTHER PUBLICATIONS

Korean Intellectual Property Office Notice of Submission of Argument; Mailed Mar. 25, 2011 in KR Application No. 10-2009-0118985.
Japanese Office Action issued in Publication No. 2008-321522 on May 12, 2011.

* cited by examiner

*Primary Examiner* — Justin P Misleh
(74) *Attorney, Agent, or Firm* — Edwards Wildman Palmer LLP; David G. Conlin; George N. Chaclas

(57) ABSTRACT

A solid-state image capturing apparatus according to the present invention includes: a plurality of photoelectric conversion sections; a charge accumulation section; and a charge readout section, the apparatus further includes: a semiconductor substrate including a plurality of diffusion layers formed thereabove, the diffusion layers constituting the photoelectric conversion sections, the charge accumulation section and the charge readout section; a readout gate electrode formed above the semiconductor substrate and constituting the charge readout section; an insulation sidewall formed on a side surface of the readout gate electrode; and a surface diffusion layer constituting the photoelectric conversion sections, which is positioned in a self-aligning manner with respect to the readout gate electrode by the insulation sidewall.

37 Claims, 11 Drawing Sheets

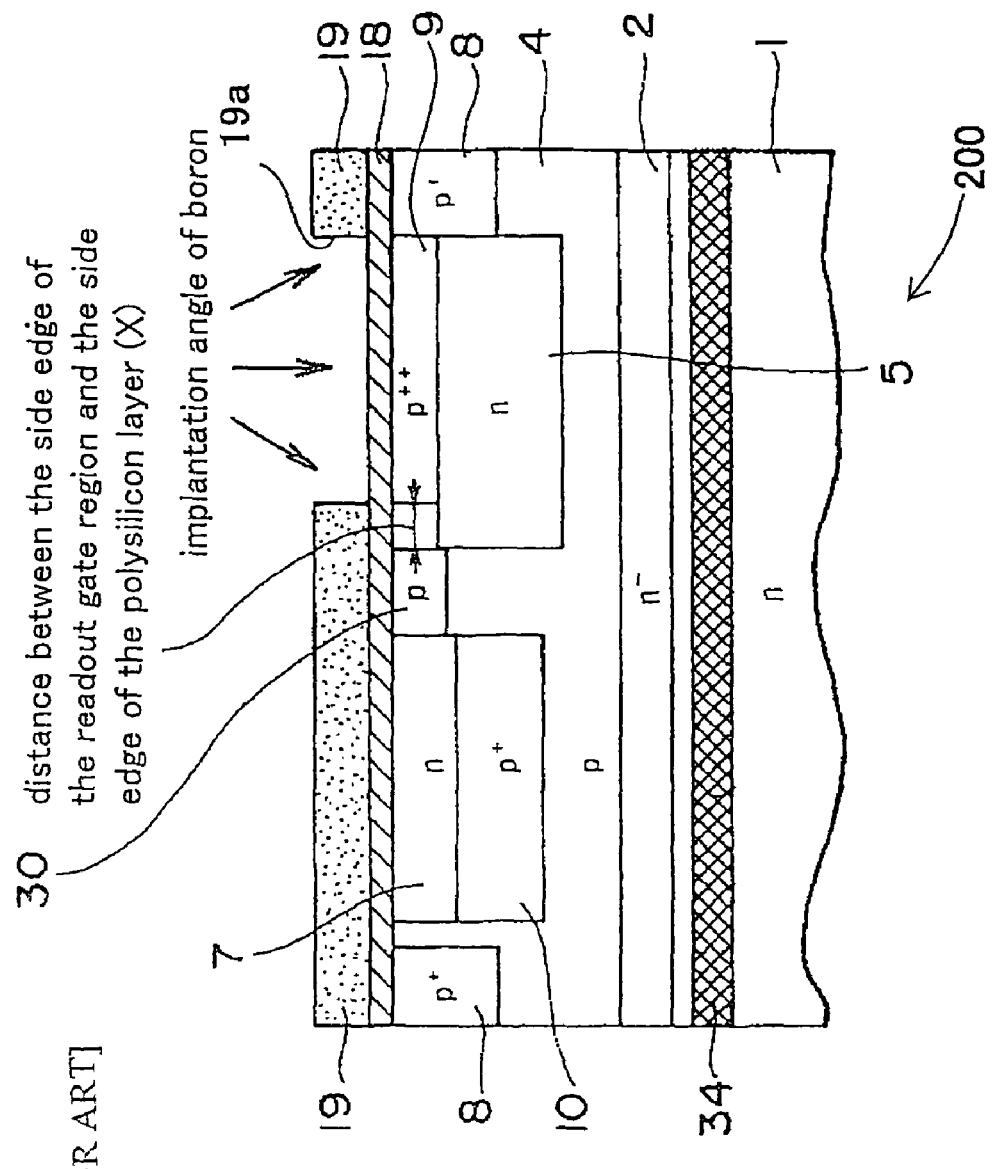
Fig. 11 [PRIOR ART]

SOLID-STATE IMAGE CAPTURING APPARATUS, METHOD FOR MANUFACTURING SAME, AND ELECTRONIC INFORMATION DEVICE

This nonprovisional application claims priority under 35 U.S.C. §119(a) to Patent Application No. 2008-321522 filed in Japan on Dec. 17, 2008, the entire contents of which are hereby incorporated by reference.

BACKGROUND OF THE INVENTION

1. Field of the Invention

The present invention is related to: a solid-state image capturing apparatus; a method for manufacturing the solid-state image capturing apparatus; and an electronic information device, and more specifically, a solid-state image capturing apparatus including light-receiving sections each constituted of an embedded photodiode and capable of reading out a signal charge from the light-receiving section in low voltage drive and realizing low-noise and high-definition images, a method for manufacturing the solid-state image capturing apparatus, and an electronic information device including the solid-state image capturing apparatus.

2. Description of the Related Art

Conventionally, a solid-state image capturing apparatus includes a CCD solid-state image capturing apparatus and a CMOS solid-state image capturing apparatus. For example, Reference 1 discloses a conventional CCD solid-state image capturing apparatus.

FIG. 11 is a schematic view of the solid-state image capturing apparatus disclosed in Reference 1.

A conventional solid-state image capturing apparatus 200 shown in FIG. 11 includes: an n-type impurity diffusion layer 5, which forms a sensor region (light-receiving section) on a substrate 1 such as a wafer; a p-type impurity diffusion layer 7, which forms a transfer channel region (charge transferring section) for transferring a signal charge generated in the light-receiving section; and a p-type impurity diffusion layer 30 (hereinafter, also referred to as "diffusion layer 30"), which forms a readout gate region (ROG) for reading out the signal charge generated in the light-receiving section to the transfer channel region. In addition, in the solid-state image capturing apparatus 200 a transfer electrode 19, including an opening 19a at a section corresponding to the sensor region, is formed on the substrate 1 with a gate insulation layer 18 interposed therebetween.

The diffusion layer 7 of the transfer channel region, the impurity diffusion layer 5 of the sensor region, and impurity diffusion layer 30 of the readout gate region, are formed prior to the formation of the transfer electrode 19. A p-type diffusion layer 9 in a surface portion of the sensor region is formed by ion implantation via the opening 19a of the electrode 19.

In the solid-state image capturing apparatus 200 shown in FIG. 11, prior to the formation of an n-type epitaxial layer 2 of the substrate 1, a carbon implantation region 34 is formed for reducing dark current or white defects. In addition, the n-type silicon epitaxial layer 2 is formed above the substrate 1, and a p-type semiconductor well region 4 is formed within the epitaxial layer 2. Further, within the p-type semiconductor well region 4, the diffusion layer 7 of the transfer channel region, an n-type channel stop layer 8, and another p-type well region 10 are formed respectively by selective ion implantations of n-type and p-type impurities.

In such a configuration, as the transfer electrode 19 is formed after the formation of the readout gate region (ROG) 30 and the impurity diffusion layer 5, a positional offset and the like made when forming the opening of the transfer electrode 19 cause a distance X between the readout gate region (ROG) 30 and an edge of the opening of the transfer electrode in the direction along the surface of the substrate.

In the solid-state image capturing apparatus 200, the distance X is measured, for example, for each wafer, and the ion implantation angle of boron for forming the p-type diffusion layer 9 of the surface of the sensor region 5 is adjusted such that a region between the readout gate region (ROG) 30 and the p-type diffusion layer 9 has an appropriate concentration in accordance with the distance X.

Reference 1: Japanese Laid-Open Publication No. 2005-159062

SUMMARY OF THE INVENTION

As described above, in the manufacturing method of the solid-state image capturing apparatus disclosed in Cited Reference 1, the ion implantation angle is set based on the positional relationship between the edge of the opening of the transfer electrode and the edge of the readout gate region, and an impurity concentration is adjusted in the region between the p-type diffusion layer 9 in the surface portion of the sensor region and the readout gate region 30 when ions are implanted into the surface layer portion of the sensor region via the opening of the transfer electrode. In other words, after a readout gate electrode is fabricated, and prior to the formation of an interlayer insulation film (sidewalls) thereon, the ion implantation angle is determined, and a surface $P^+$ layer for suppressing dark voltage is formed. Thereby, fluctuations in the characteristics of the device caused by variations in processing are suppressed, which achieves to improve the reliability and productivity of the solid-state image capturing apparatus.

However, in such a p-type surface diffusion layer obtained by such steps, the concentration of impurities increases in the region directly below the readout gate electrode when a higher concentration of the implanted ions is attempted in order to further reduce dark current. As a result, problems such as an increase in a residual image and image deterioration occur.

The present invention is intended to solve the conventional problems described above. The objective of the present invention is to provide a solid-state image capturing apparatus capable of suppressing residual image deterioration due to an increase of readout voltage even when a p-type diffusion layer formed in the surface portion of a light-receiving section achieves a high concentration in order to suppress dark current; a method for manufacturing such a solid-state image capturing apparatus; and an electronic information device using such a solid-state image capturing apparatus therein.

A solid-state image capturing apparatus according to the present invention includes: a plurality of photoelectric conversion sections for generating a signal charge by a photoelectric conversion on incident light; a charge accumulation section for accumulating the signal charge generated by each of the photoelectric conversion section; and a charge readout section for reading out the signal charge from each of the photoelectric conversion sections to the charge accumulation section, the solid-state image capturing apparatus further including: a semiconductor substrate including a plurality of diffusion layers formed thereabove, the diffusion layers constituting the photoelectric conversion sections, the charge accumulation section and the charge readout section; a readout gate electrode formed above the semiconductor substrate and constituting the charge readout section; an insulation sidewall formed on a side surface of the readout gate electrode; and a surface diffusion layer constituting the photoelectric conversion sections, the surface diffusion layer being positioned in a self-aligning manner with respect to the readout gate electrode by the insulation sidewall, thereby achieving the objective described above.

Preferably, in a solid-state image capturing apparatus according to the present invention, the semiconductor substrate is a first type conductivity semiconductor substrate, a second type conductivity well region is formed in the first type conductivity semiconductor substrate, a first type conductivity photodiode region constituting the photoelectric conversion sections is formed in the second type conductivity well region, and the surface diffusion layer constituting the photoelectric conversion sections is a second type conductivity photodiode diffusion layer formed above the first type conductivity photodiode region.

Still preferably, in a solid-state image capturing apparatus according to the present invention, the first type conductivity photodiode region is surrounded by a second type conductivity isolating diffusion region such that the adjacent photoelectric conversion sections are electrically isolated.

Still preferably, in a solid-state image capturing apparatus according to the present invention, the readout gate electrode is formed above the first type conductivity semiconductor substrate with a gate insulation film interposed therebetween such that an end portion of the readout gate electrode overlaps with at least a part of an end portion of the first type conductivity photodiode region.

Still preferably, in a solid-state image capturing apparatus according to the present invention, the insulation sidewall is a portion of an insulation covering layer positioned on the side surface of the readout gate electrode, the insulation covering layer being formed to reflect the height difference of the surfaces thereunder and to cover the readout gate electrode and the first type conductivity photodiode region above the semiconductor substrate.

Still preferably, in a solid-state image capturing apparatus according to the present invention, the insulation sidewall is a gate electrode sidewall insulation film formed in a self-aligning manner with respect to the readout gate electrode such that the gate electrode insulating film remains only on the side surface of the readout gate electrode above the semiconductor substrate.

Still preferably, in a solid-state image capturing apparatus according to the present invention, the surface diffusion layer constituting each photoelectric conversion section is a second type conductivity photodiode region positioned in a self-aligning manner by ion implantation of a second type conductivity dopant using the readout gate electrode and the insulation sidewall on the side surface of the readout gate electrode as a mask.

Still preferably, in a solid-state image capturing apparatus according to the present invention, the surface diffusion layer constituting the photoelectric conversion section is a second type conductivity photodiode region positioned in a self-aligning manner by ion implantation of a second type conductivity dopant using the readout gate electrode and the gate electrode sidewall insulation film on the side surface of the readout gate electrode as a mask.

Still preferably, in a solid-state image capturing apparatus according to the present invention, the dopant which is implanted into the second type conductivity photodiode region by ion implantation is boron.

Still preferably, in a solid-state image capturing apparatus according to the present invention, the surface diffusion layer as the second type conductivity photodiode region has impurity concentration X within a range of $2E18\ cm^{-3} \leq X \leq 1E19\ cm^{-3}$.

Still preferably, in a solid-state image capturing apparatus according to the present invention, the surface diffusion layer as the second type conductivity photodiode region has a thickness Y within a range of $0.05\ \mu m \leq Y \leq 0.30\ \mu m$.

Still preferably, in a solid-state image capturing apparatus according to the present invention, the insulation sidewall has a width Z within a range of $0.02\ \mu m \leq Z \leq 0.10\ \mu m$.

Still preferably, in a solid-state image capturing apparatus according to the present invention, a region between the readout gate electrode and the second type conductivity photodiode region is an extension of the surface diffusion layer, the region being positioned at the lower side of the insulation sidewall above the semiconductor substrate, the region being obtained by thermally diffusing the dopant from the second type conductivity photodiode region to the end of the readout gate electrode and expanding the second type conductivity photodiode region by a thermal treatment activating the dopant implanted into the second type conductivity photodiode region by ion implantation.

A method for manufacturing a solid-state image capturing apparatus according to the present invention is provided, the solid-state image capturing apparatus including: a plurality of photoelectric conversion sections for generating a signal charge by a photoelectric conversion on incident light; a charge accumulation section for accumulating the signal charge generated by each of the photoelectric conversion sections; and a charge readout section for reading out the signal charge from each of the photoelectric conversion sections to the charge accumulation section, the method including the steps of: forming a readout gate electrode constituting the charge readout section, above the semiconductor substrate; forming an insulation sidewall on a side surface of the readout gate electrode in a self-aligning manner; and positioning and forming a surface diffusion layer constituting the photoelectric conversion section with respect to the readout gate electrode by ion implantation using the readout gate electrode and the insulation sidewall on the side surface of the readout gate electrode, as a mask, thereby achieving the objective described above.

Preferably, in a method for manufacturing a solid-state image capturing apparatus according to the present invention, as a step preceding the step of forming the readout gate electrode, the method further includes the steps of: forming a second type conductivity well region on a first type conductivity semiconductor substrate as the semiconductor substrate; and forming a first type conductivity photodiode region constituting the photoelectric conversion section, in the second type conductivity well region, and a second type conductivity photodiode region is formed above the first type conductivity photodiode region as the surface diffusion layer in the step of forming the surface diffusion layer.

Still preferably, in a method for manufacturing a solid-state image capturing apparatus according to the present invention, the first type conductivity photodiode region is surrounded by a second type conductivity isolating diffusion region such that the adjacent photoelectric conversion sections are electrically isolated from one another.

Still preferably, in a method for manufacturing a solid-state image capturing apparatus according to the present invention, in the step of forming the readout gate electrode, the readout gate electrode is formed above the first type conductivity semiconductor substrate with a gate insulation film interposed therebetween such that an end portion of the readout gate electrode overlaps with at least a part of an end portion of the first type conductivity photodiode region.

Still preferably, in a method for manufacturing a solid-state image capturing apparatus according to the present invention, in the step of forming the insulation sidewall, an insulation covering layer is formed above the semiconductor substrate to reflect the height difference of surfaces thereunder to cover the readout gate electrode and the first type conductivity photodiode region, and the insulation sidewall is formed as a portion of the insulation covering layer on the side surface of the readout gate electrode.

Still preferably, in a method for manufacturing a solid-state image capturing apparatus according to the present invention, in the step of forming the insulation sidewall, an insulation covering layer is formed above the semiconductor substrate to reflect the height difference of surfaces thereunder to cover the readout gate electrode and the first type conductivity photodiode region, and then the insulation covering layer is etched away to leave the insulation covering layer only on the side surface of the readout gate electrode to form the insulation sidewall.

Still preferably, in a method for manufacturing a solid-state image capturing apparatus according to the present invention, in the step of forming the surface diffusion layer constituting each photoelectric conversion section, the surface diffusion layer is formed as a second type conductivity photodiode region in a self-aligning manner by ion implantation of a second type conductivity dopant using the readout gate electrode and the insulation sidewall on the side surface of the readout gate electrode as a mask.

Still preferably, in a method for manufacturing a solid-state image capturing apparatus according to the present invention, in the step of forming the surface diffusion layer constituting each photoelectric conversion section, the surface diffusion layer is formed as a second type conductivity photodiode region in a self-aligning manner by ion implantation of a second type conductivity dopant using the readout gate electrode and the insulation sidewall on the side surface of the readout gate electrode as a mask.

Still preferably, in a method for manufacturing a solid-state image capturing apparatus according to the present invention, boron is implanted as the dopant into the second type conductivity photodiode region by ion implantation.

Still preferably, in a method for manufacturing a solid-state image capturing apparatus according to the present invention, impurity concentration X of the second type conductivity photodiode region is within a range of $2E18\ cm^{-3} \leq X \leq 1E19\ cm^{-3}$.

Still preferably, in a method for manufacturing a solid-state image capturing apparatus according to the present invention, the surface diffusion layer as the second type conductivity photodiode region is formed so as to have a thickness Y within a range of $0.05\ \mu m \leq Y \leq 0.30\ \mu m$.

Still preferably, in a method for manufacturing a solid-state image capturing apparatus according to the present invention, the insulation sidewall is formed so as to have a width Z within a range of $0.02\ \mu m \leq Z \leq 0.10\ \mu m$.

Still preferably, in a method for manufacturing a solid-state image capturing apparatus according to the present application, a portion between the readout gate electrode and the second type conductivity photodiode region is an extension of the surface diffusion layer, the portion being positioned at the lower side of the insulation sidewall above the semiconductor substrate, the second type conductivity region is formed by thermally diffusing the dopant from the second type conductivity photodiode region to an end portion of the readout gate electrode by a thermal treatment activating the dopant implanted into the second type conductivity photodiode region by ion implantation.

An electronic information device according to the present invention includes an image capturing section for capturing an image of a subject, and the image capturing section is a solid-state image capturing apparatus according to the present invention; thereby achieving the objective described above.

The functions of the present invention will be described hereinafter.

In the present invention, a dopant is implanted using the insulation sidewalls disposed adjacent to the readout gate electrode as a mask when the surface diffusion layer, constituting a photoelectric conversion section, is formed. Thereby, suppression of image deterioration is possible even when the dopant concentration in the surface diffusion layer is increased, thereby reducing dark current. As a result, it is possible to realize low-noise and high-definition image capturing, which can be read out with a low drive voltage.

In the present invention, the insulation sidewalls are portions of an insulation covering layer positioned on the side surface of the readout gate electrode, the insulation covering layer being formed to reflect the height difference of the surfaces thereunder to cover the readout gate electrode and a first type conductivity photodiode region above a semiconductor substrate. Thereby, it is possible to prevent contamination of the first conductivity type photodiode region in the manufacturing process. As a result, a high-quality solid-state image capturing apparatus can be provided in a stable manner, and the productivity of the solid-state image capturing apparatus can be improved.

In the present invention, the insulation sidewalls are defined to be a gate electrode sidewall insulation film formed in a self-aligning manner with respect to the readout gate electrode in such a way that the insulation sidewalls remain only on the side surface of the readout gate electrode above the semiconductor substrate. Accordingly, a photolithographic process, for such a step of removing unnecessary portions of the insulation layer forming the insulation sidewalls, becomes unnecessary, so that a high-quality solid-state image capturing apparatus can be stably provided in a more simple manner, and the productivity of the solid-state image capturing apparatus can be improved.

According to the present invention as described above, by forming the readout gate electrode constituting the electric charge readout region above the semiconductor substrate, forming the insulation sidewalls in a self-aligning manner on the side surface of the readout gate electrode, and forming the surface diffusion layer constituting the photoelectric conversion region by implanting ion using the readout gate electrode and the insulation sidewall on the side surface of the readout gate electrode as a mask while determining the position of the surface diffusion layer with respect to the readout gate electrode, the surface diffusion layer is self-aligned by the insulation sidewalls on the side of the readout gate electrode with respect to the readout gate electrode. Accordingly, the distance between the readout gate electrode and the surface diffusion layer constituting the photoelectric conversion region can be defined with accuracy and is reproducible, and as a result, it becomes possible to stably provide a solid-state image capturing apparatus with low-noise and high-definition in which dark voltage is suppressed to a low level while residual image deterioration is suppressed.

These and other advantages of the present invention will become apparent to those skilled in the art upon reading and understanding the following detailed description with reference to the accompanying figures.

BRIEF DESCRIPTION OF THE DRAWINGS

FIGS. 3(a) to 3(c) illustrate a process up to the formation of a readout gate electrode above a substrate in the order of manufacture.

FIGS. 4(a) to 4(c) illustrate a process up to the formation of a surface $P^+$ layer of the photodiode portion after the formation of the readout gate electrode in the order of manufacture.

FIGS. 9(a) to 9(d) illustrate a process up to the formation of the surface $P^+$ layer of a photodiode region after the formation of the readout gate electrode in the order of manufacture.

FIG. 11 is a schematic view of the solid-state image capturing apparatus disclosed in Reference 1.

Figure 1:
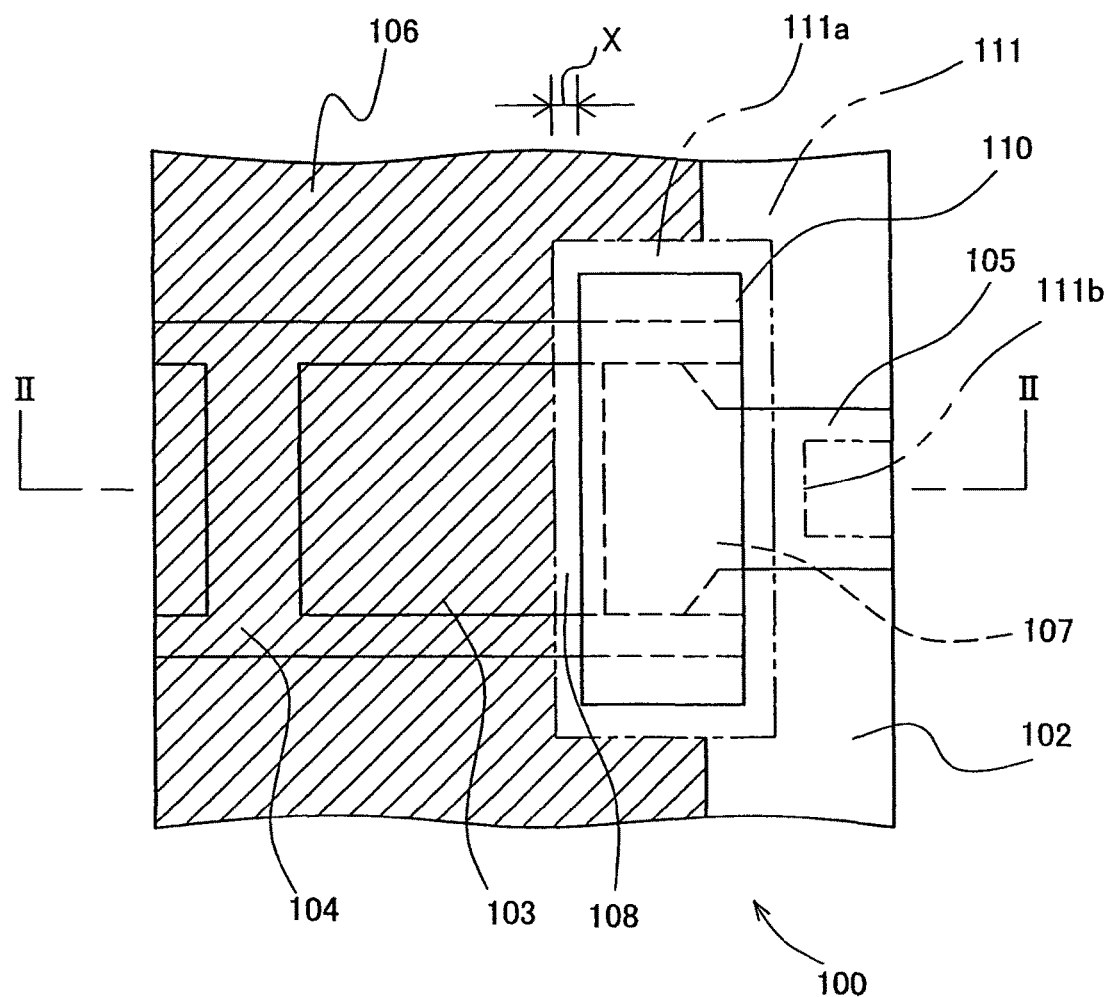
FIG. 1 is a plan view describing a solid-state image capturing apparatus, according to Embodiment 1 of the present invention, illustrating an essential part layout of pixels constituting the solid-state image capturing apparatus.

90 electronic information device
91 image capturing section
92 memory section
93 display section
94 communication section
95 image output section
100, 100a solid-state image capturing apparatus
101 N type silicon substrate (N-Sub)
102 $P^-$ well
103 $N^-$ type conductivity PD diffusion layer
104 $P^-$ type conductivity isolating diffusion layer
105 $N^+$ type conductivity FD diffusion layer
106 $P^+$ type conductivity surface PD diffusion layer
107 $P^-$ type conductivity readout diffusion layer
108 $P^-$ type conductivity surface diffusion layer (surface $P^-$ layer)
110 readout gate electrode
111 CVD insulation film
111a gate electrode sidewall portion (sidewall portion)
111b CVD film opening
111c gate electrode sidewall (sidewall)

DESCRIPTION OF THE PREFERRED EMBODIMENTS

Hereinafter, embodiments of the present invention will be described with reference to the accompanying figures.

Embodiment 1

Figure 2:
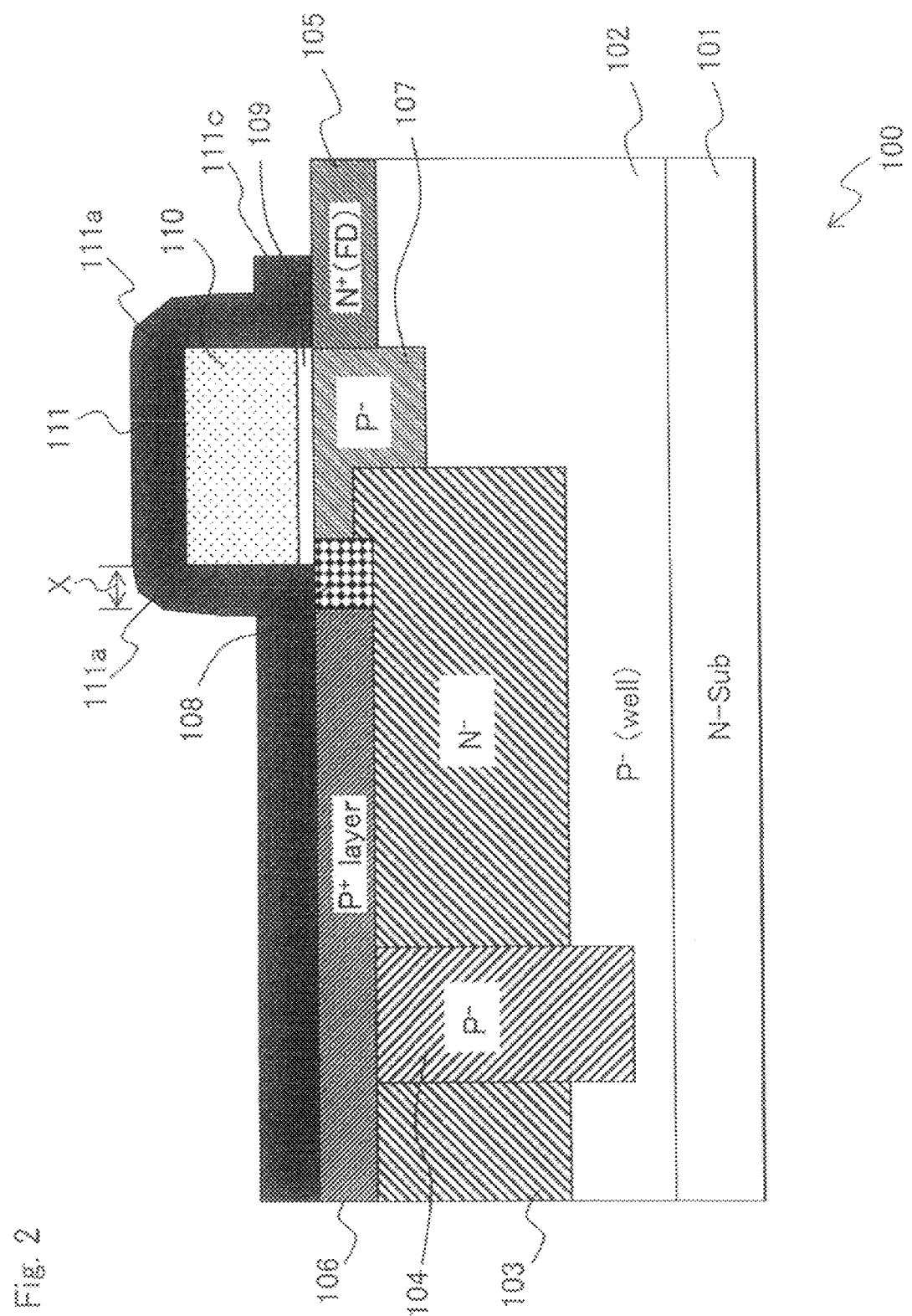
FIG. 2 is a cross sectional view describing the solid-state image capturing apparatus according to Embodiment 1, illustrating a structure of the cross section along the line II-II of FIG. 1.

FIG. 1 is a plan view describing a solid-state image capturing apparatus according to Embodiment 1 of the present invention, illustrating an essential part layout of pixels constituting the solid-state image capturing apparatus. FIG. 2 is across sectional view describing the solid-state image capturing apparatus according to Embodiment 1, illustrating a structure of the cross section along the line II-II of FIG. 1.

A solid-state image capturing apparatus 100 of Embodiment 1 includes, a $P^-$ well 102 formed on an N type silicon substrate (N-Sub) 101. In the $P^-$ well 102, an $N^-$ type conductivity PD diffusion layer 103, which constitutes a photoelectric conversion region (hereinafter, also referred to as "light-receiving section or photodiode") is arranged in a matrix and an $N^+$ type conductivity FD diffusion layer 105, which constitutes an electric charge accumulation region (FD), is formed in such a manner to oppose to the PD diffusion layer 103. Also, between the diffusion layers 103 and 105, a $P^-$ type conductivity readout diffusion layer 107 is formed, which constitutes a readout region (channel region) for reading out a signal charge generated in the photoelectric conversion region to the FD diffusion layer (electric charge accumulation region) 105. Above the readout diffusion layer 107, a readout gate electrode 110, constituted of a polysilicon or the like, is placed with a gate oxide film 109 interposed therebewteen.

The PD diffusion layer 103 is surrounded by a $P^-$ type conductivity isolating diffusion layer 104 for electrically isolating the adjacent light-receiving sections, and a $P^+$ type conductivity surface PD diffusion layer 106 is formed on the PD diffusion layer 103 in such a manner to extend over the adjacent light-receiving sections. A distance X between the readout gate electrode side edge of the surface PD diffusion layer 106 and the opposing side edge of the gate electrode 110 is defined by the width of the insulation film at the sidewall portions of the readout gate electrode (sidewall portions) 110a, the insulation film being formed on the readout gate electrode 110 and the surface PD diffusion layer 106 by a CVD method to reflect the height difference therebetween. That is, the distance X is equivalent to the film thickness of the insulation film 111.

A region between the readout gate electrode side edge of the surface PD diffusion layer 106 and the opposing diffusion layer 107 is the $P^-$ type conductivity surface diffusion layer (surface $P^-$ layer) 108 in which P type impurity is diffused from the $P^+$ type conductivity surface PD diffusion layer. The impurity concentration of the $P^-$ type isolating diffusion layer 104 is higher than the impurity concentration of the $P^-$ type readout diffusion layer 107.

Next, a method for manufacturing the solid-state image capturing apparatus will be described.

Figure 3:
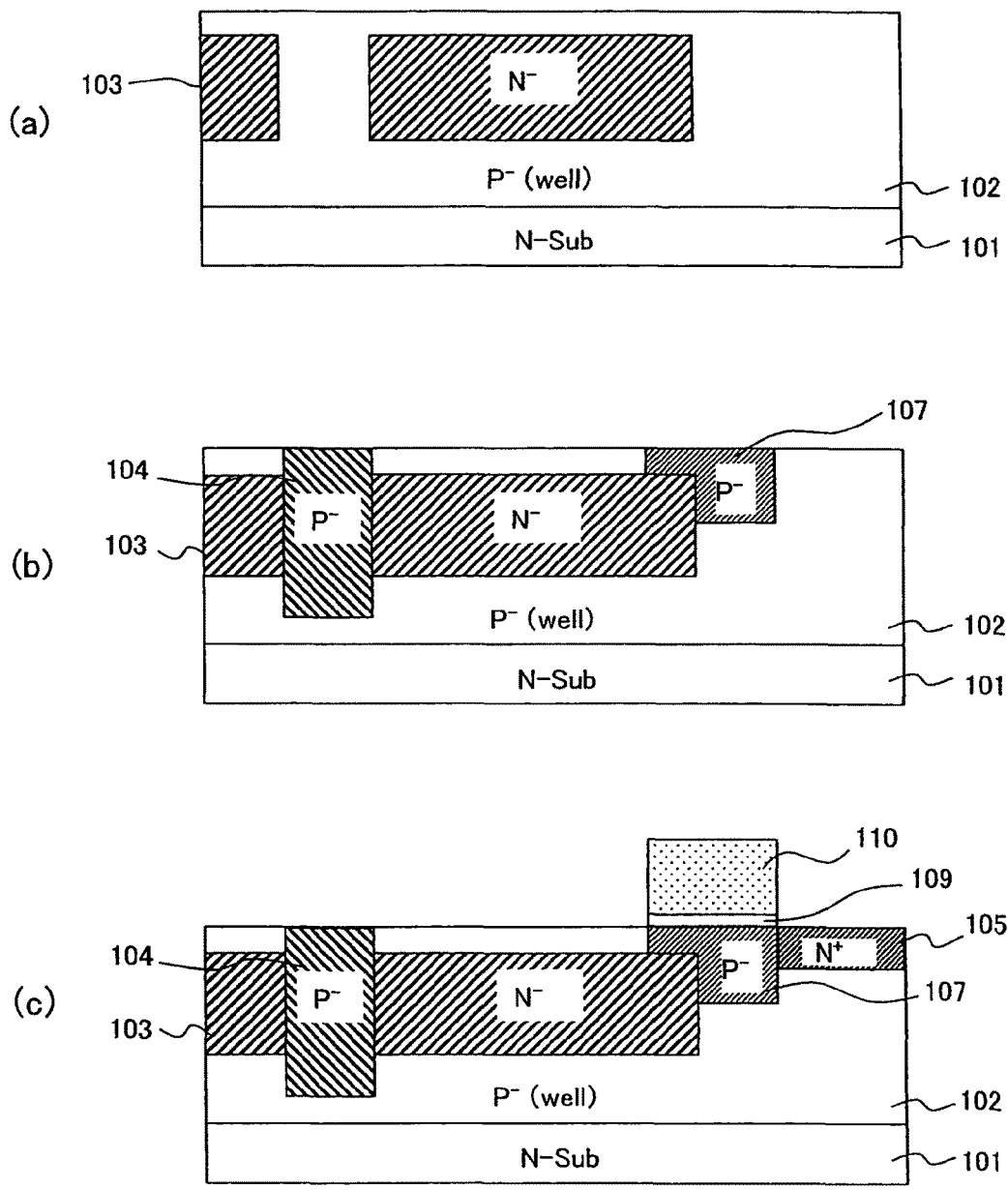
FIG. 3 is a cross sectional view describing a method for manufacturing the solid-state image capturing apparatus according to Embodiment 1 of the present invention.
Figure 4:
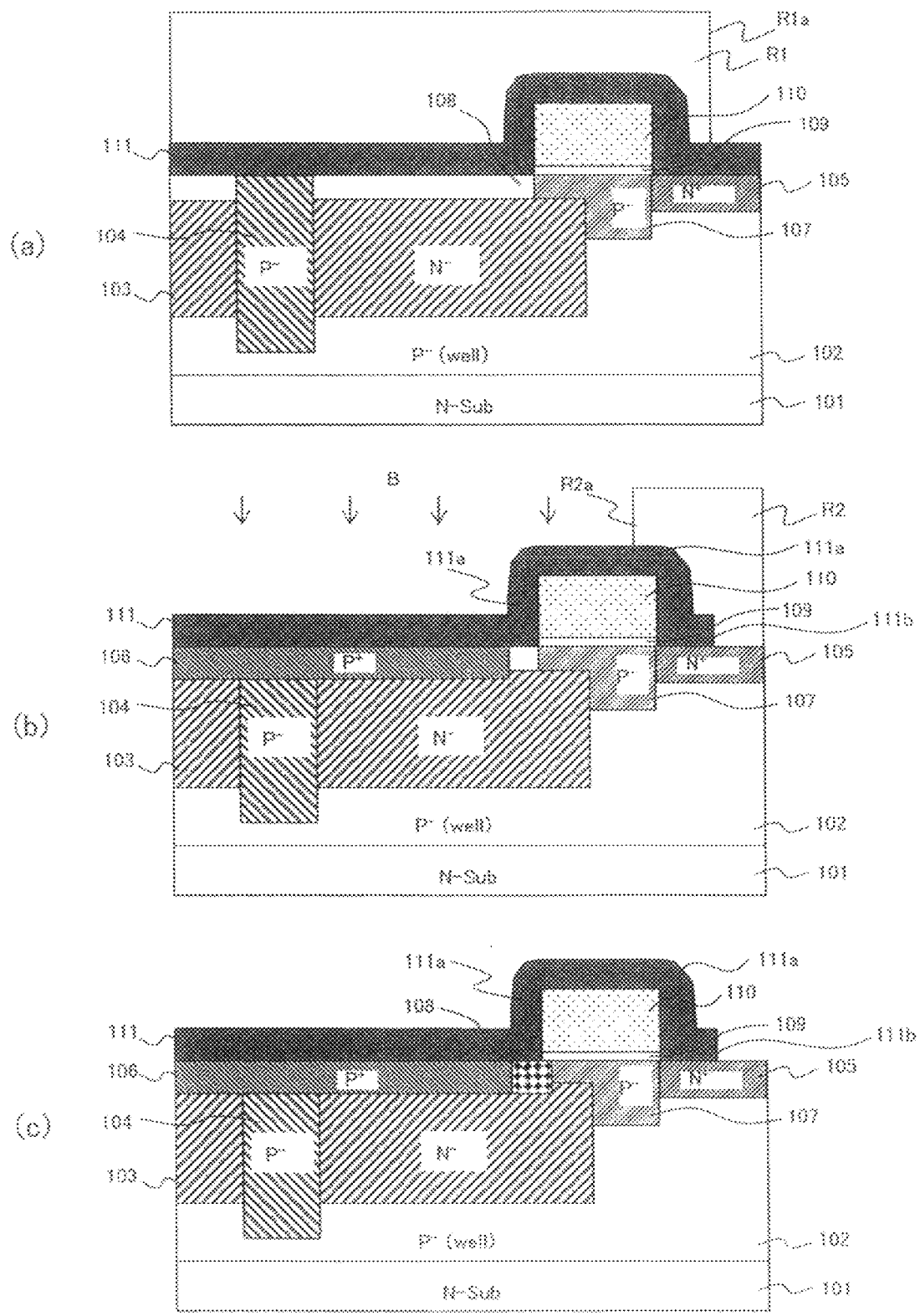
FIG. 4 is a cross sectional view describing a method for manufacturing the solid-state image capturing apparatus according to Embodiment 1 of the present invention.

FIGS. 3 and 4 are each a cross sectional view illustrating a method for manufacturing the solid-state image capturing apparatus according to Embodiment 1. FIGS. 3(a) to 3(c) show the process up to the formation of the readout gate electrode above the substrate in the order of manufacture. FIGS. 4(a) to 4(c) show the process up to the formation of the surface P+ layer of the photodiode region after the formation of the readout gate electrode in the order of manufacture.

First, for example, the P− well 102 is formed on the semiconductor substrate (N-Sub) 101 such as silicon having an N type conductivity, and then, arsenic (As) is selectively implanted into the P− well 102 by a photolithographic technique and ion implantation to form the N− type conductivity diffusion layer 103 constituting the light-receiving section (photodiode) (FIG. 3 (a)).

Then, boron (B) is selectively implanted into the P− well 102 by ion implantation to form the P− type conductivity isolating diffusion layer 104 for electrically isolating light-receiving sections in such a manner to surround the N− type conductivity diffusion layer 103, and then boron (B) is selectively implanted into one end side of the N− type conductivity diffusion layer 103 to form the P− type conductivity readout diffusion layer 107 constituting the readout gate region (FIG. 3 (b)).

Then, a gate insulation film ($SiO_2$ film) 109 is formed on the P− type conductivity readout diffusion layer 107, and then, the readout gate electrode 110 is formed by patterning of a polysilicon layer above the readout diffusion layer 107 with the gate insulation film ($SiO_2$ film) interposed therebetween, and then, arsenic (As) or phosphorus (P) is implanted into the P− well 102 by ion implantation using the gate electrode 110 as a mask to form the N+ type FD diffusion layer 105 in a self-aligning manner with respect to the gate electrode 110 (FIG. 3 (c)).

Next, a nitride film (SiN film) 111 is formed over the entirety of the surface by the CVD method with the thickness between 0.02 µm and 0.10 µm in such a manner to reflect the height difference thereunder, and then, a first resist film R1 is formed by a photolithographic process in a manner such that a resist opening R1a will be disposed at a region above the FD diffusion layer 105 (FIG. 4 (a)).

The nitride film 111 is etched using the first resist film R1 as an etching mask, and then, an opening is formed in the nitride film 111 at a portion over the FD diffusion layer 105 to form a contact region with a wiring layer, and then, the resist film R1 is removed. Further, a second resist film R2 is formed to cover at least the N+ type conductivity FD diffusion layer 105, and boron (B) ions are implanted using the second resist film R2, the readout gate electrode 110 and a gate electrode sidewall portions 111a of the nitride film 111 as an ion implantation mask to form the P+ type conductivity surface PD diffusion layer 106 in a self-aligning manner, at a certain distance X, with respect to the gate electrode sidewall portions 111a corresponding to the thickness of the nitride film 111 (FIG. 4 (b)). The thickness of the P+ type conductivity surface PD diffusion layer 106 is within the range of 0.05 µm to 0.30 µm, and the boron concentration is within the range of $2E18$ $cm^{-3}$ to $1E19$ $cm^{-3}$.

Further, the second resist film R2 is removed, and an ion implantation region is activated by a lamp annealing process, and then, the impurity, boron, is diffused from the P+ type conductivity surface PD diffusion layer 106 to the lower side of the gate electrode sidewall portions 111a of the nitride film 111, so that the surface P− layer 108 is formed between the readout diffusion layer 107 and the surface PD diffusion layer 106 (FIG. 4 (c)).

Then, an interlayer insulation film, wiring layer (including a light-shielding film), lens layer, color filter, and surface protection film etc., which constitute the solid-state image capturing apparatus, are formed to complete the solid-state image capturing apparatus.

The dark voltage is reduced at least by half by setting the concentration of the P+ type conductivity surface PD diffusion layer 106 to be $2E18$ $cm^{-3}$ or more.

Figure 5:
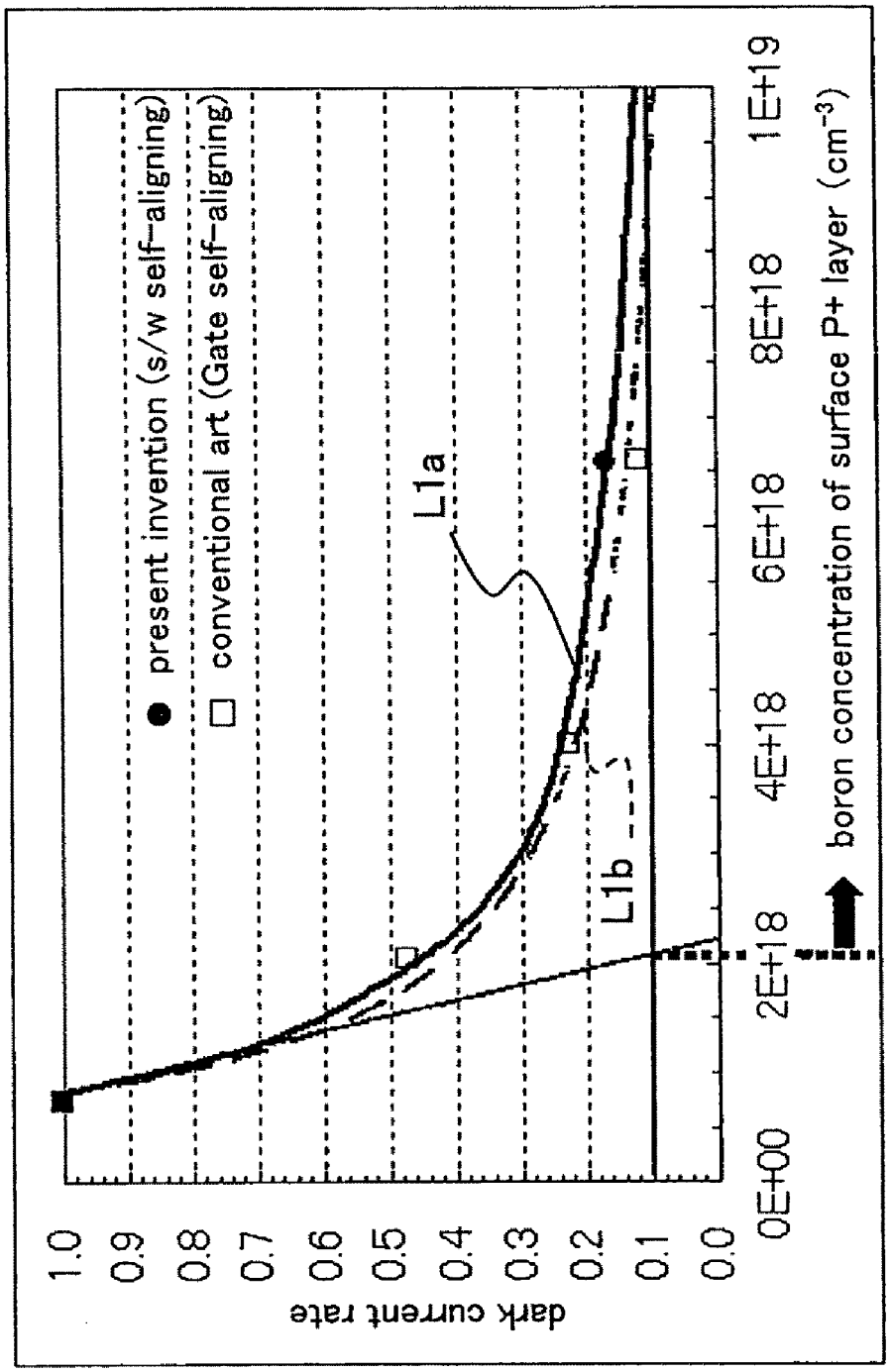
FIG. 5 is a diagram describing an effect of the present invention, illustrating the relationship between the concentration of a surface diffusion layer and a dark current improvement rate.
Figure 6:
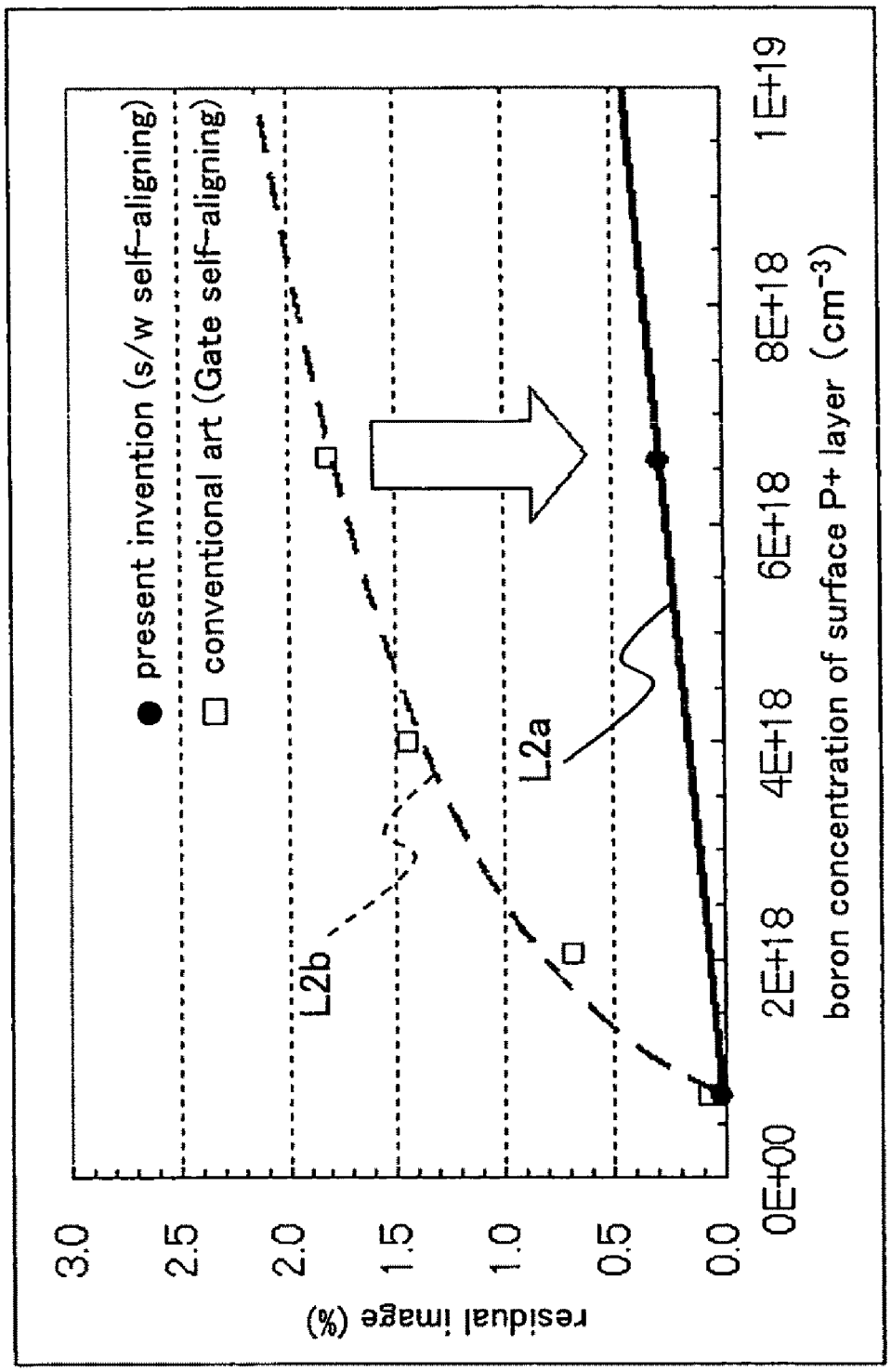
FIG. 6 is a diagram describing an effect of the present invention, illustrating the relationship between the concentration of the surface diffusion layer and residual images.

FIGS. 5 and 6 are diagrams explaining an effect of the present invention. FIG. 5 shows the relationship between the concentration of the surface diffusion layer and a dark current improvement rate (a dark current rate). FIG. 6 shows the relationship between the concentration of the surface diffusion layer and residual images.

FIG. 5 shows a dark current improvement rate with respect to the concentration of the surface diffusion layer by a curved line L1a (S/W self-aligning) in the case when the P+ type conductivity surface PD diffusion layer 106 is formed in a self-aligning manner with respect to the gate electrode sidewall portions 111a as in the present invention, and shows a dark current improvement rate with respect to the concentration of the surface diffusion layer by a broken line L1b (Gate self-aligning) in a case when the P+ type conductivity surface PD diffusion layer 106 is formed in a self-aligning manner with respect to the gate electrode 110 as in the conventional technique (Reference 1).

As can be understood from the lines L1a and L1b in the chart, the dark current rate abruptly decreases with the increasing boron concentration in the P+ type conductivity surface PD diffusion layer 106 up to $2E18$ $cm^{-3}$. Accordingly, as shown in FIG. 5, when the boron concentration in the P+ type conductivity surface PD diffusion layer 106 is within the range of $2E18$ $cm^{-3}$ to $1E19$ $cm^{-3}$, it is understood that dark current can be greatly reduced.

FIG. 6 shows the extent of the residual image with respect to the concentration of the surface diffusion layer by a line L2a (S/W self-aligning) in a case when the P+ type conductivity surface PD diffusion layer 106 is formed in a self-aligning manner with respect to the gate electrode sidewall portions 111a as in the present invention, and shows the extent of the residual image with respect to the concentration of the surface diffusion layer by a line L2b (Gate self-aligning) in a case when the P+ type conductivity surface PD diffusion layer 106 is formed in a self-aligning manner with respect to the gate electrode 110 as in the conventional technique (Reference 1).

The extent of the residual image is determined based on an output signal from the solid-state image capturing apparatus. As a brief explanation, for example, an output signal level A is determined by one time readout operation after irradiating light to the solid-state image capturing apparatus, and then, an output signal level B is determined by performing the readout operation once again. The output signal level B is zero when there is no residual image, ideally, whereas the signal level B is a signal level corresponding to the ratio of the residual image when there is a residual image. Herein, the ratio of the residual image is determined according to the ratio of the output signal level A to the output signal level B.

As can be understood from the lines L2a and L2b in the chart, the ratio of the residual image, which increases as the boron concentration increases in the P+ type conductivity surface PD diffusion layer 106 up to $2E18$ $cm^{-3}$, is smaller in the present invention of the conventional technique. For example, when the boron concentration in the P+ type conductivity surface PD diffusion layer 106 is $2E18$ $cm^{-3}$, the residual image in the present invention is reduced to about one-sixth of the conventional technique. More specifically, in a case where the P+ type conductivity surface PD diffusion layer 106 is formed in a self-aligning manner with respect to the readout gate electrode sidewalls as in the present invention, the residual image is reduced to one-sixth or less compared to the conventional technique in which the P+ type conductivity surface PD diffusion layer 106 is formed in a self-aligning manner with respect to the readout gate within the range of 1E19 cm$^{-3}$ or less of the concentration in the surface PD diffusion layer.

In the solid-state image capturing apparatus 100 according to Embodiment 1 with the structure described above, after the gate electrode sidewall portions 111a are formed, the high concentration P+ type conductivity surface PD diffusion layer 106 on the N⁻ type conductivity PD diffusion layer 103 is formed in a self-aligning manner with respect to the readout gate electrode, so that the sidewalls (S/W) 111a become an implantation mask, and it becomes possible to set an offset between the readout gate electrode 110 and the P+ type conductivity surface PD diffusion layer 106 with accuracy and reproducibility. Thereby, it becomes possible to suppress the residual image deterioration due to an increase in readout voltage when the P+ type conductivity surface PD diffusion layer is has a high concentration required for suppressing dark voltage. As a result, it becomes possible to stably manufacture, without characteristic variations, the solid-state image capturing apparatus having no residual image deterioration and being capable of reducing noise that is observable when there is no light (dark voltage).

Also, in Embodiment 1, the insulation sidewalls are the portions 111a of the insulation film (nitride film) 111 located on the side surface of the readout gate electrode, the insulation film 111 being formed to reflect the height difference of the surfaces thereunder to cover the readout gate electrode and the first conductivity type photodiode region above the semiconductor substrate, thereby, preventing incorporation of pollutants (contamination) in the N⁻ type conductivity PD diffusion layer 103 by the manufacturing process of the nitride film 111. As a result, the high-quality solid-state image capturing apparatus can be provided in a stable manner, and the productivity of the solid-state image capturing apparatus can be improved.

Embodiment 2

Figure 7:
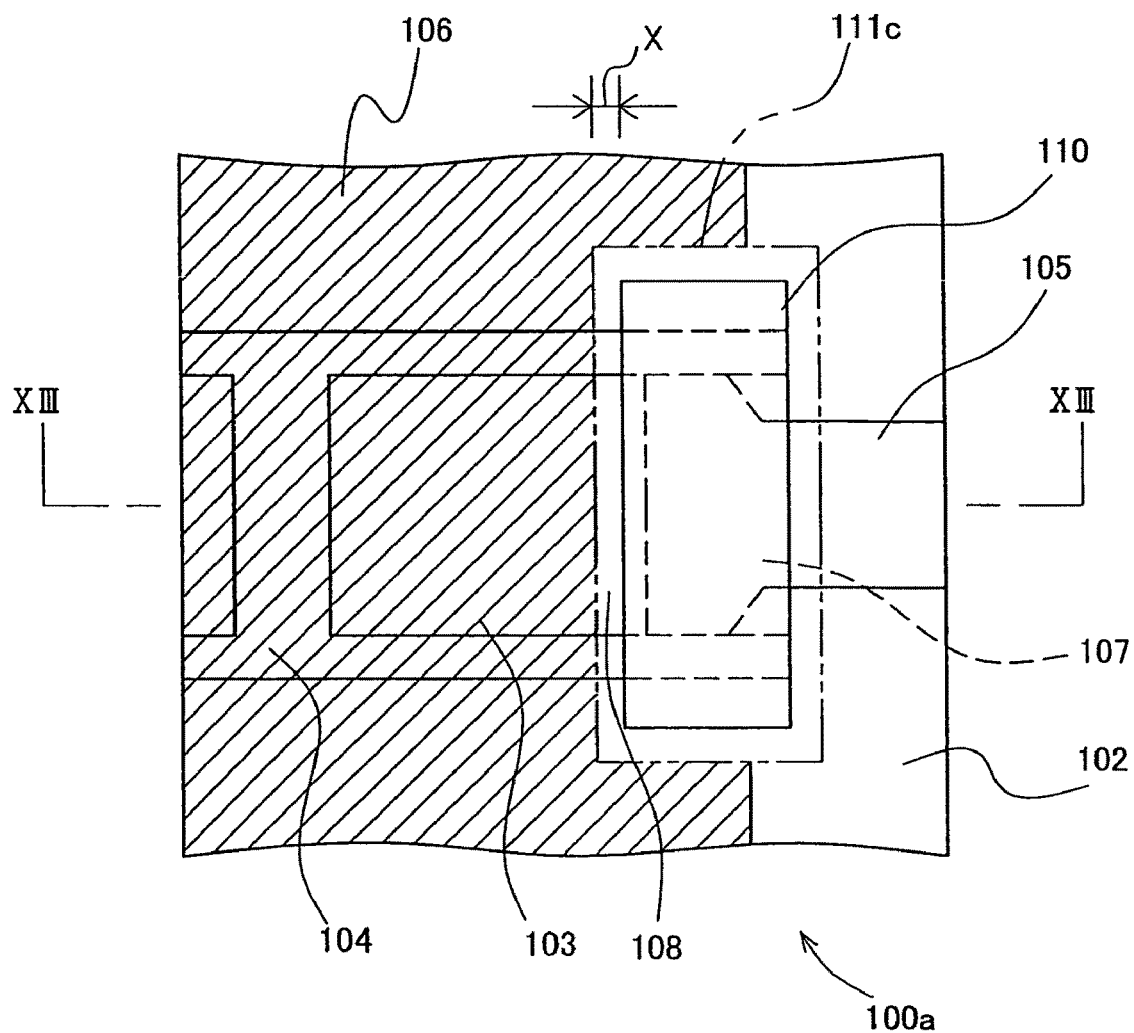
FIG. 7 is a plan view describing a solid-state image capturing apparatus according to Embodiment 2 of the present invention, illustrating an essential part layout of pixels constituting the solid-state image capturing apparatus.
Figure 8:
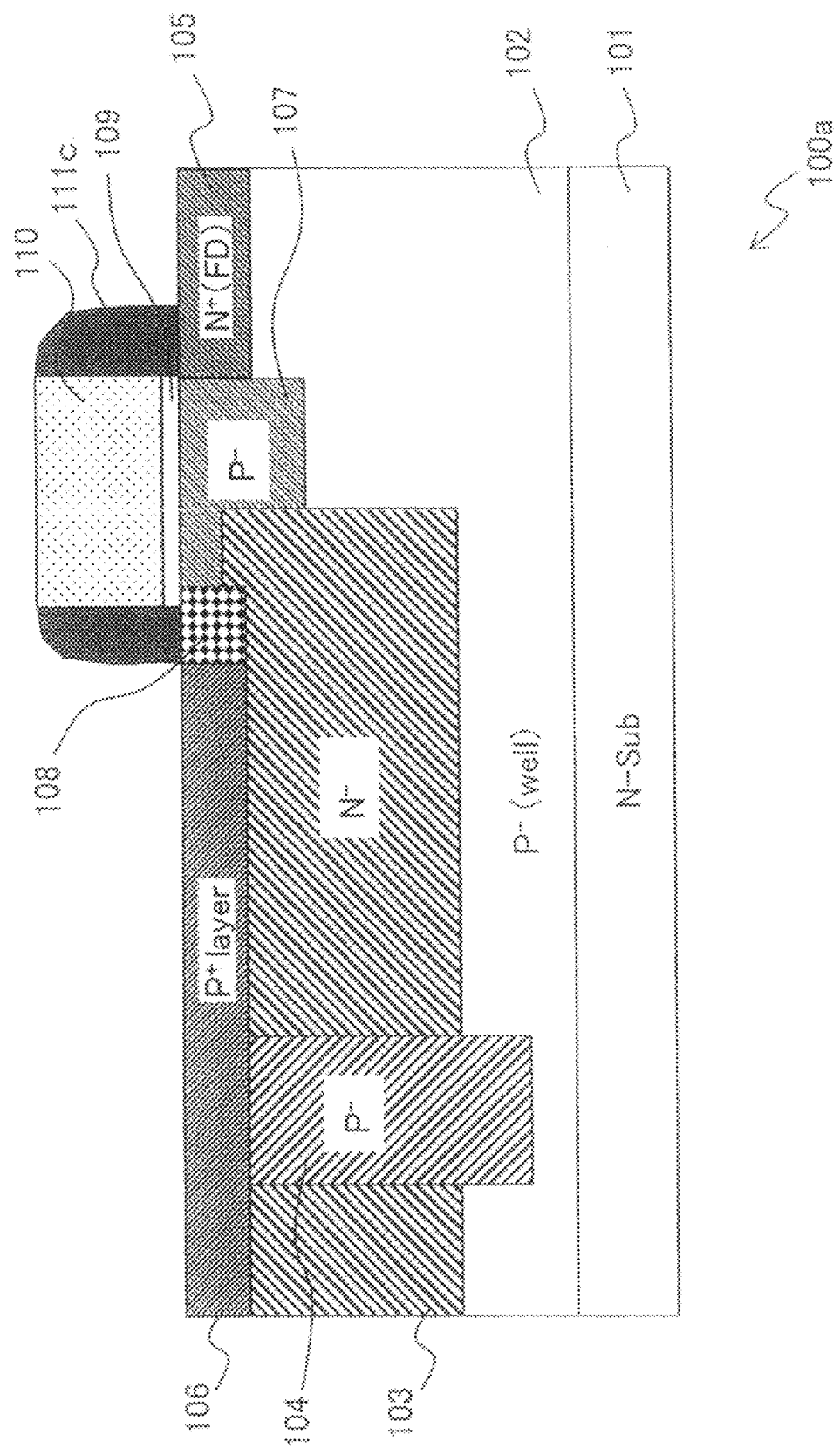
FIG. 8 is a cross sectional view describing the solid-state image capturing apparatus according to Embodiment 2, illustrating a structure of the cross section along the line XIII-XIII of FIG. 7.

FIG. 7 is a plan view describing a solid-state image capturing apparatus according to Embodiment 2 of the present invention, illustrating a layout of an essential part of pixels constituting the solid-state image capturing apparatus. FIG. 8 is a cross sectional view describing the solid-state image capturing apparatus according to Embodiment 2, illustrating a structure of the cross section along the line XIII-XIII of FIG. 7.

The solid-state image capturing apparatus 100a according to Embodiment 2 has a structure where the CVD film 111, which is formed on the readout gate electrode 110 in the solid-state image capturing apparatus 100 according to Embodiment 1 in a manner to reflect the height difference thereunder, is etched away such that only the portions of the CVD film 111 adjacent to the side surface portions of the readout gate electrode 110 remain. The solid-state image capturing apparatus 100a according to Embodiment 2 is different from the solid-state image capturing apparatus 100 according to Embodiment 1 in this regard.

That is, the solid-state image capturing apparatus 100a according to Embodiment 2 includes, the P⁻ well 102 formed on the N type silicon substrate (N-Sub) 101. In the P⁻ well 102, the N⁻ type conductivity PD diffusion layer 103 arranged in a matrix and the N+ type conductivity FD diffusion layer 105 is formed in such a manner to oppose to the PD diffusion layer 103. Also, between the diffusion layers 103 and 105, the P⁻ type conductivity readout diffusion layer 107 is formed as a channel region. Above the readout diffusion layer 107, the readout gate electrode 110 is placed with the gate oxide film 109 interposed therebetween.

The PD diffusion layer 103 is surrounded by the P⁻ type conductivity isolating diffusion layer 104, which electrically isolates the adjacent light-receiving sections, and the P+ type conductivity surface PD diffusion layer 106 is formed on the PD diffusion layer 103 in such a manner to extend over the adjacent light-receiving sections. A distance X between the readout gate electrode side edge of the surface PD diffusion layer 106 and the side edge of the gate electrode 110 opposing this is defined by the width of readout gate electrode sidewall portions (sidewall portions) 111c. The sidewall portions 111c are ones which are obtained by etching away the insulation film (nitride film) 111, which is formed by the CVD method, on the readout gate electrode and the surface PD diffusion layer, in such a manner to reflect the height difference thereunder.

Moreover, a region between the readout gate electrode side edge of the surface PD diffusion layer 106 and the opposing diffusion layer 107 is the P⁻ type conductivity surface diffusion layer (surface P⁻ layer) 108 in which P type impurity is diffused from the P+ type conductivity surface PD diffusion layer.

Next, a method for manufacturing the solid-state image capturing apparatus will be described.

Figure 9:
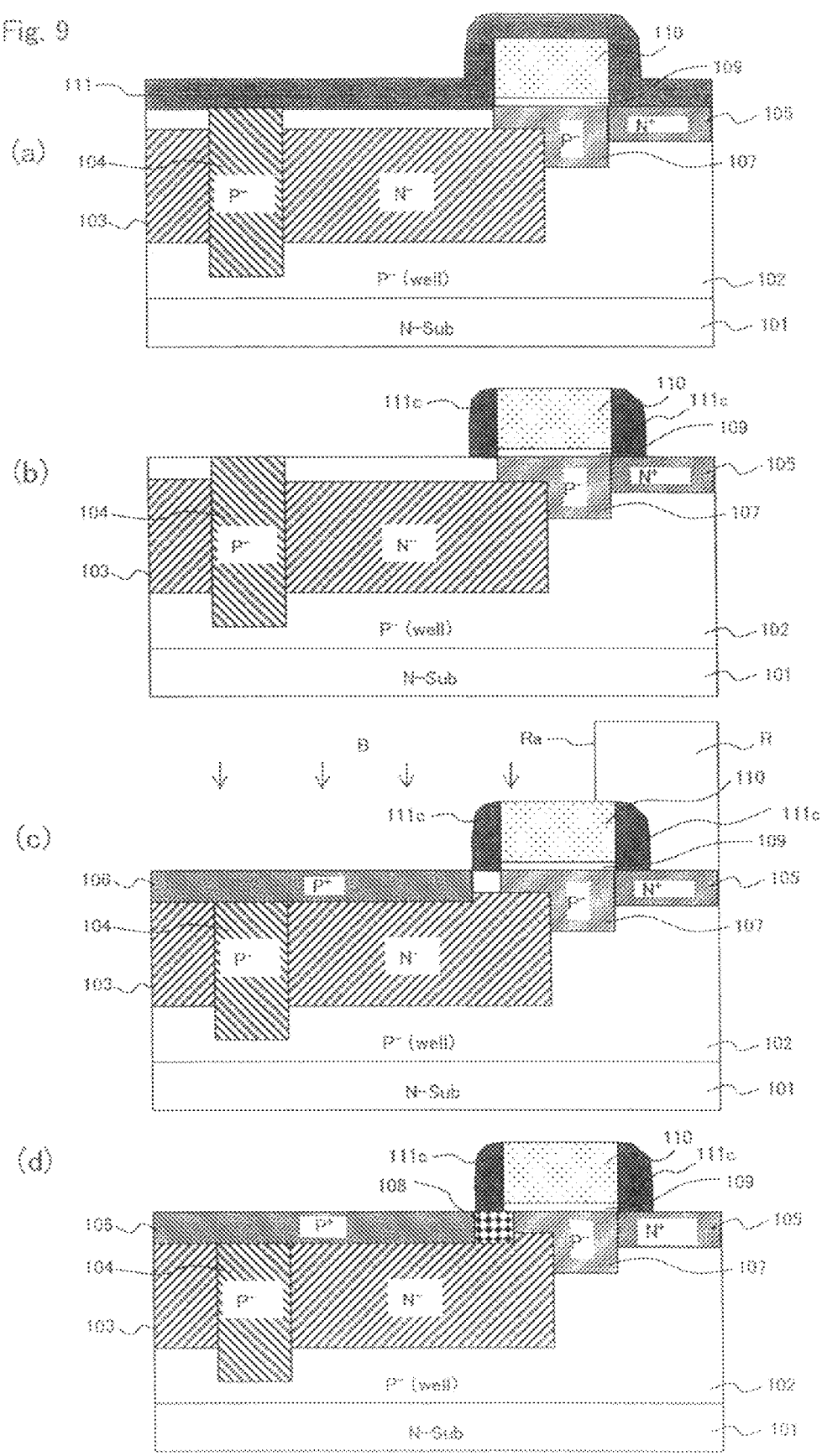
FIG. 9 is a cross sectional view describing a method for manufacturing the solid-state image capturing apparatus according to Embodiment 2.

FIG. 9 is a cross sectional view describing a method for manufacturing the solid-state image capturing apparatus according to Embodiment 2. FIGS. 9(a) to 9(d) show a process up to the formation of the surface P+ layer of a photodiode region after the formation of the readout gate electrode in the order of manufacture.

In the method for manufacturing the solid-state image capturing apparatus according to Embodiment 2, the process up to the formation of the readout gate electrode above the substrate is performed in the same manner as the method for manufacturing the solid-state image capturing apparatus according to Embodiment 1 (see FIGS. 3(a) to 3(c)).

As described above, the readout gate electrode 110 is formed above the substrate, and then, the nitride film (SiN film) 111 is formed on the entirety of the surface by a CVD method with the thickness between 0.02 μm and 0.10 μm in such a manner to reflect the height difference thereunder (FIG. 9(a)).

Then, the CVD film 111 is etched away isotropically to leave the sidewall nitride film (sidewalls) 111c on the side surfaces of the readout gate electrode 110 (FIG. 9(b)).

In the following process, the same steps as illustrated in FIGS. 4(b) and 4(c) according to Embodiment 1 are performed.

In brief, a resist film R having a resist opening Ra is formed to cover the N+ type conductivity FD diffusion layer 105, and then, boron (B) ions are implanted using the resist film R, the readout gate electrode 110 and the gate electrode sidewall portions 111c as an ion implantation mask to form the P+ type conductivity surface PD diffusion layer 106 in a self-aligning manner, at a certain distance X, corresponding to the thickness of the nitride film (CVD film) 111, with respect to the gate electrode 110 (FIG. 9 (c)). The thickness of the P+ type conductivity surface PD diffusion layer 106 is within the range of 0.05 μm to 0.30 μm, and the boron concentration is within the range of 2E18 cm$^{-3}$ to 1E19 cm$^{-3}$.

Further, the resist film R is removed, and the ion implantation region is activated by a lamp annealing process, and then, an impurity, boron, is diffused from the P+ type conductivity surface PD diffusion layer 106 to the lower side of the gate electrode sidewall portions 111c of the nitride film, so that the surface P− layer 108 is formed between the readout diffusion layer 107 and the surface PD diffusion layer 106 (FIG. 9 (d)).

Then, an interlayer insulation film, wiring layer (including a light-shielding film), lens layer, color filter, and surface protection film etc., which constitute the solid-state image capturing apparatus, are formed to complete the solid-state image capturing apparatus.

In the solid-state image capturing apparatus 100a according to Embodiment 2 with the structure described above, the high concentration P+ type conductivity surface PD diffusion layer 106 is formed in a self-aligning manner with respect to the sidewalls 111c formed on the readout gate electrode sidewalls, so that the sidewalls 111c become an implantation mask, and it becomes possible to set an offset between the readout gate electrode 110 and the P+ type conductivity surface PD diffusion layer 106 with accuracy and reproducibility. Thereby, it becomes possible to suppress the residual image deterioration due to an increase of readout voltage when the P+ type conductivity surface PD diffusion layer has a high concentration required for suppressing dark voltage. As a result, it becomes possible to stably manufacture, without characteristic anomalies, the solid-state image capturing apparatus having no residual image deterioration and being capable of reducing noise that is observable when there is no light (dark voltage).

Also, in Embodiment 2, the readout gate electrode is formed, and then, the CVD film which is formed to reflect the height difference of the surfaces thereunder, is etched away entirely to form the sidewalls on the side surfaces of the readout gate electrode, so that a process for forming an opening 111b as a contact region with the wiring (see FIGS. 1 and 4) in the CVD film at a portion on the FD diffusion layer 106 becomes unnecessary, and then, the photolithographic process can be eliminated. Consequently, a high-quality solid-state image capturing apparatus can be stably provided in a more simple manner, and the productivity of the solid-state image capturing apparatus can be improved.

Although not specifically described in Embodiments 1 and 2 above, an electronic information device having an image input device, such as a digital camera (e.g., a digital video camera or a digital still camera), an image input camera, a scanner, a facsimile machine, and a camera-equipped cell phone device, including at least either of the solid-state image capturing apparatus according to Embodiments 1 and 2 as an image capturing section of the electronic information device, will be described, hereinafter.

Embodiment 3

Figure 10:
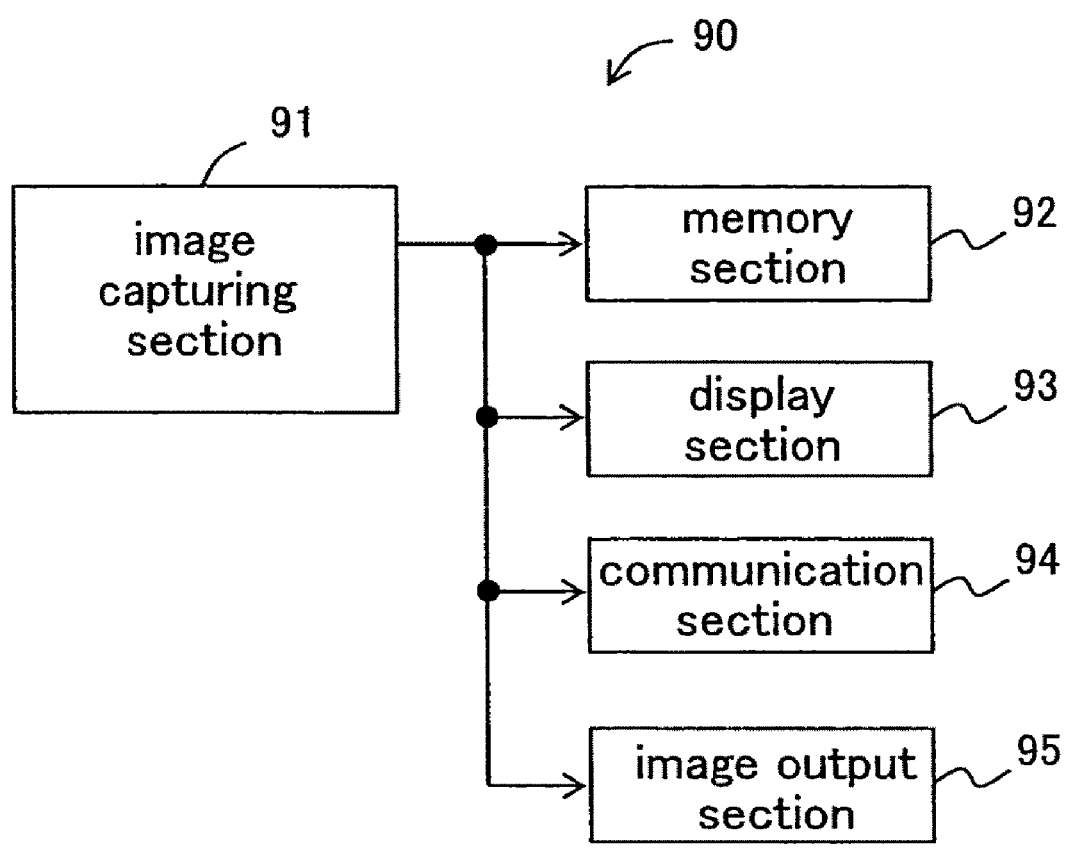
FIG. 10 is a block diagram schematically illustrating an exemplary structure of an electronic information device according to Embodiment 3 of the present invention, including the solid-state image capturing apparatus according to Embodiments 1 or 2 of the present invention in an image capturing section thereof.

FIG. 10 is a block diagram schematically illustrating an exemplary structure of an electronic information device of Embodiment 3 of the present invention, including at least one of the solid-state image capturing apparatus according to Embodiments 1 and 2 of the present invention in an image capturing section thereof.

In FIG. 10, an electronic information device 90 according to Embodiment 3 of the present invention includes: the solid-state image capturing apparatus according to either of Embodiments 1 and 2 of the present invention as an image capturing section 91 for capturing an image of a subject, and the electronic information device 90 further includes at least one of: a memory section 92 (e.g., recording media) for data-recording a high-quality image data obtained by using at least one of the solid-state image capturing apparatus according to Embodiments 1 and 2 in an image capturing section, after a predetermined signal process is performed on the image data for recording; a display section 93 (e.g., a liquid crystal display apparatus) for displaying the image data from the solid-state image capturing apparatus 91 on a display screen (e.g., liquid crystal display screen) after predetermined signal processing is performed on the image data for display; a communication section 94 (e.g., a transmitting and receiving device) for communicating the image data from the solid-state image capturing apparatus 91 after predetermined signal processing is performed on the image data for communication; and an image output section 95 for printing (typing) the image data from the solid-state image capturing apparatus 91 and outputting (printing out) the image data after predetermined signal processing is performed for printing.

As described above, the present invention is exemplified by the use of its preferred Embodiments. However, the present invention should not be interpreted solely based on Embodiments described above. It is understood that the scope of the present invention should be interpreted solely based on the claims. It is also understood that those skilled in the art can implement equivalent scope of technology, based on the description of the present invention and common knowledge from the description of the detailed preferred Embodiments of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a solid-state image capturing apparatus including light-receiving sections each constituted of an embedded photodiode, and capable of reading out a signal charge from the light-receiving section in low drive voltage and realizing low-noise and high-definition images, a method for manufacturing such a solid-state image capturing apparatus, and an electronic information device including such a solid-state image capturing apparatus. According to the present invention it is possible to suppress residual image deterioration due to an increase of readout voltage even when the p-type diffusion layer formed on the surface of the light-receiving section has a high concentration for suppressing dark current.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing apparatus, comprising:
a plurality of photoelectric conversion sections for generating a signal charge by a photoelectric conversion on incident light;
a charge accumulation section for accumulating the signal charge generated by each of the photoelectric conversion sections; and
a charge readout section for reading out the signal charge from each of the photoelectric conversion sections to the charge accumulation section, the solid-state image capturing apparatus further comprising:

a semiconductor substrate including a plurality of diffusion layers formed thereabove, the diffusion layers constituting the photoelectric conversion sections, the charge accumulation section and the charge readout section;

a readout gate electrode formed above the semiconductor substrate and constituting the charge readout section;

an insulation sidewall formed on a side surface of the readout gate electrode; and a surface diffusion layer constituting the photoelectric conversion sections, the surface diffusion layer being positioned in a self-aligning manner with respect to the readout gate electrode by the insulation sidewall.

2. A solid-state image capturing apparatus according to claim 1, wherein the semiconductor substrate is a first type conductivity semiconductor substrate, a second type conductivity well region is formed in the first type conductivity semiconductor substrate, a first type conductivity photodiode region constituting the photoelectric conversion sections is formed in the second type conductivity well region, and the surface diffusion layer constituting the photoelectric conversion sections is a second type conductivity photodiode diffusion layer formed above the first type conductivity photodiode region.

3. A solid-state image capturing apparatus according to claim 2, wherein the first type conductivity photodiode region is surrounded by a second type conductivity isolating diffusion region such that the adjacent photoelectric conversion sections are electrically isolated.

4. A solid-state image capturing apparatus according to claim 2, wherein the readout gate electrode is formed above the first type conductivity semiconductor substrate with a gate insulation film interposed therebetween such that an end portion of the readout gate electrode overlaps with at least a part of an end portion of the first type conductivity photodiode region.

5. A solid-state image capturing apparatus according to claim 2, wherein the insulation sidewall is a portion of an insulation covering layer positioned on the side surface of the readout gate electrode, the insulation covering layer being formed to reflect the height difference of the surfaces thereunder and to cover the readout gate electrode and the first type conductivity photodiode region above the semiconductor substrate.

6. A solid-state image capturing apparatus according to claim 2, wherein the insulation sidewall is a gate electrode sidewall insulation film formed in a self-aligning manner with respect to the readout gate electrode such that the gate electrode insulating film remains only on the side surface of the readout gate electrode above the semiconductor substrate.

7. A solid-state image capturing apparatus according to claim 5, wherein the surface diffusion layer constituting each photoelectric conversion section is a second type conductivity photodiode region positioned in a self-aligning manner by ion implantation of a second type conductivity dopant using the readout gate electrode and the insulation sidewall on the side surface of the readout gate electrode as a mask.

8. A solid-state image capturing apparatus according to claim 6, wherein the surface diffusion layer constituting the photoelectric conversion section is a second type conductivity photodiode region positioned in a self-aligning manner by ion implantation of a second type conductivity dopant using the readout gate electrode and the gate electrode sidewall insulation film on the side surface of the readout gate electrode as a mask.

9. A solid-state image capturing apparatus according to claim 7, wherein the dopant which is implanted into the second type conductivity photodiode region by ion implantation is boron.

10. A solid-state image capturing apparatus according to claim 9, wherein the surface diffusion layer as the second type conductivity photodiode region has impurity concentration X within a range of $2E18\ cm^{-3} \leq X \leq 1E19\ cm^{-3}$.

11. A solid-state image capturing apparatus according to claim 9, wherein the surface diffusion layer as the second type conductivity photodiode region has a thickness Y within a range of $0.05\ \mu m \leq Y \leq 0.30\ \mu m$.

12. A solid-state image capturing apparatus according to claim 9, wherein the insulation sidewall has a width Z within a range of $0.02\ \mu m \leq Z \leq 0.10\ \mu m$.

13. A solid-state image capturing apparatus according to claim 8, wherein the dopant which is implanted into the second type conductivity photodiode region by ion implantation is boron.

14. A solid-state image capturing apparatus according to claim 13, wherein the surface diffusion layer as the second type conductivity photodiode region has impurity concentration X within a range of $2E18\ cm^{-3} \leq X \leq 1E19\ cm^{-3}$.

15. A solid-state image capturing apparatus according to claim 13, wherein the surface diffusion layer as the second type conductivity photodiode region has a thickness Y within a range of $0.05\ \mu m \leq Y \leq 0.30\ \mu m$.

16. A solid-state image capturing apparatus according to claim 13, wherein the insulation sidewall has a width Z within a range of $0.02\ \mu m \leq Z \leq 0.10\ \mu m$.

17. A solid-state image capturing apparatus according to claim 7, wherein a region between the readout gate electrode and the second type conductivity photodiode region is an extension of the surface diffusion layer, the region being positioned at the lower side of the insulation sidewall above the semiconductor substrate, the region being obtained by thermally diffusing the dopant from the second type conductivity photodiode region to the end of the readout gate electrode and expanding the second type conductivity photodiode region by a thermal treatment activating the dopant implanted into the second type conductivity photodiode region by ion implantation.

18. A solid-state image capturing apparatus according to claim 8, wherein a region between the readout gate electrode and the second type conductivity photodiode region is an extension of the surface diffusion layer, the region being positioned at the lower side of the insulation sidewall above the semiconductor substrate, the region being obtained by thermally diffusing the dopant from the second type conductivity photodiode region to the end of the readout gate electrode and expanding the second type conductivity photodiode region by a thermal treatment activating the dopant implanted into the second type conductivity photodiode region by ion implantation.

19. A method for manufacturing a solid-state image capturing apparatus, the solid-state image capturing apparatus comprising:

a plurality of photoelectric conversion sections for generating a signal charge by a photoelectric conversion on incident light;

a charge accumulation section for accumulating the signal charge generated by each of the photoelectric conversion sections; and a charge readout section for reading out the signal charge from each of the photoelectric conversion sections to the charge accumulation section, the method comprising the steps of:
forming a readout gate electrode constituting the charge readout section, above the semiconductor substrate;
forming an insulation sidewall on a side surface of the readout gate electrode in a self-aligning manner; and
positioning and forming a surface diffusion layer constituting the photoelectric conversion section with respect to the readout gate electrode by ion implantation using the readout gate electrode and the insulation sidewall on the side surface of the readout gate electrode, as a mask.

20. A method for manufacturing a solid-state image capturing apparatus according to claim 19,
wherein, as a step preceding the step of forming the readout gate electrode, the method further includes the steps of:
forming a second type conductivity well region on a first type conductivity semiconductor substrate as the semiconductor substrate; and
forming a first type conductivity photodiode region constituting the photoelectric conversion section, in the second type conductivity well region, and
wherein, a second type conductivity photodiode region is formed above the first type conductivity photodiode region as the surface diffusion layer in the step of forming the surface diffusion layer.

21. A method for manufacturing a solid-state image capturing apparatus according to claim 20, wherein the first type conductivity photodiode region is surrounded by a second type conductivity isolating diffusion region such that the adjacent photoelectric conversion sections are electrically isolated from one another.

22. A method for manufacturing a solid-state image capturing apparatus according to claim 20, wherein, in the step of forming the readout gate electrode, the readout gate electrode is formed above the first type conductivity semiconductor substrate with a gate insulation film interposed therebetween such that an end portion of the readout gate electrode overlaps with at least a part of an end portion of the first type conductivity photodiode region.

23. A method for manufacturing a solid-state image capturing apparatus according to claim 20, wherein, in the step of forming the insulation sidewall, an insulation covering layer is formed above the semiconductor substrate to reflect the height difference of surfaces thereunder to cover the readout gate electrode and the first type conductivity photodiode region, and the insulation sidewall is formed as a portion of the insulation covering layer on the side surface of the readout gate electrode.

24. A method for manufacturing a solid-state image capturing apparatus according to claim 20, wherein, in the step of forming the insulation sidewall, an insulation covering layer is formed above the semiconductor substrate to reflect the height difference of surfaces thereunder to cover the readout gate electrode and the first type conductivity photodiode region, and then the insulation covering layer is etched away to leave the insulation covering layer only on the side surface of the readout gate electrode to form the insulation sidewall.

25. A method for manufacturing a solid-state image capturing apparatus according to claim 23, wherein, in the step of forming the surface diffusion layer constituting each photoelectric conversion section, the surface diffusion layer is formed as a second type conductivity photodiode region in a self-aligning manner by ion implantation of a second type conductivity dopant using the readout gate electrode and the insulation sidewall on the side surface of the readout gate electrode as a mask.

26. A method for manufacturing a solid-state image capturing apparatus according to claim 24, wherein, in the step of forming the surface diffusion layer constituting each photoelectric conversion section, the surface diffusion layer is formed as a second type conductivity photodiode region in a self-aligning manner by ion implantation of a second type conductivity dopant using the readout gate electrode and the insulation sidewall on the side surface of the readout gate electrode as a mask.

27. A method for manufacturing a solid-state image capturing apparatus according to claim 25, wherein boron is implanted as the dopant into the second type conductivity photodiode region by ion implantation.

28. A method for manufacturing a solid-state image capturing apparatus according to claim 27, wherein impurity concentration X of the second type conductivity photodiode region is within a range of $2E18\ cm^{-3} \leq X \leq 1E19\ cm^{-3}$.

29. A method for manufacturing a solid-state image capturing apparatus according to claim 27, wherein the surface diffusion layer as the second type conductivity photodiode region is formed so as to have a thickness Y within a range of $0.05\ \mu m \leq Y \leq 0.30\ \mu m$.

30. A method for manufacturing a solid-state image capturing apparatus according to claim 27, wherein the insulation sidewall is formed so as to have a width Z within a range of $0.02\ \mu m \leq Z \leq 0.10\ \mu m$.

31. A method for manufacturing a solid-state image capturing apparatus according to claim 26, wherein boron is implanted as the dopant into the second type conductivity photodiode region by ion implantation.

32. A method for manufacturing a solid-state image capturing apparatus according to claim 31, wherein impurity concentration X of the second type conductivity photodiode region is within a range of $2E18\ cm^{-3} \leq X \leq 1E19\ cm^{-3}$.

33. A method for manufacturing a solid-state image capturing apparatus according to claim 31, wherein the surface diffusion layer as the second type conductivity photodiode region is formed so as to have a thickness Y within a range of $0.05\ \mu m \leq Y \leq 0.30\ \mu m$.

34. A method for manufacturing a solid-state image capturing apparatus according to claim 31, wherein the insulation sidewall is formed so as to have a width Z within a range of $0.02\ \mu m \leq Z \leq 0.10\ \mu m$.

35. A method for manufacturing a solid-state image capturing apparatus according to claim 25, wherein, a portion between the readout gate electrode and the second type conductivity photodiode region is an extension of the surface diffusion layer, the portion being positioned at the lower side of the insulation sidewall above the semiconductor substrate, the second type conductivity region is formed by thermally diffusing the dopant from the second type conductivity photodiode region to an end portion of the readout gate electrode by a thermal treatment activating the dopant implanted into the second type conductivity photodiode region by ion implantation.

36. A method for manufacturing a solid-state image capturing apparatus according to claim 26, wherein, a portion between the readout gate electrode and the second type conductivity photodiode region is an extension of the surface diffusion layer, the portion being positioned at the lower side of the insulation sidewall above the semiconductor substrate, the second type conductivity region is formed by thermally diffusing the dopant from the second type conductivity photodiode region to an end portion of the readout gate electrode by a thermal treatment activating the dopant implanted into the second type conductivity photodiode region by ion implantation.

37. An electronic information device comprising an image capturing section for capturing an image of a subject, wherein the image capturing section is a solid-state image capturing apparatus according to claim 1.

* * * * *